(12) United States Patent
Huang et al.

(10) Patent No.: US 11,175,703 B2
(45) Date of Patent: Nov. 16, 2021

(54) DISPLAY UNIT ASSEMBLY OF LAPTOP

(71) Applicant: GETAC TECHNOLOGY CORPORATION, Hsinchu County (TW)

(72) Inventors: Tzu-Chiu Huang, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/022,017

(22) Filed: Sep. 15, 2020

(65) Prior Publication Data
US 2021/0089080 A1 Mar. 25, 2021

Related U.S. Application Data

(60) Provisional application No. 62/904,967, filed on Sep. 24, 2019.

(51) Int. Cl.
*G06F 1/16* (2006.01)
*H05K 5/02* (2006.01)
*H05K 5/06* (2006.01)
*H05K 5/00* (2006.01)
*H05K 5/04* (2006.01)
*H01Q 1/22* (2006.01)
*E05D 3/02* (2006.01)
*E05D 5/04* (2006.01)
*F16C 11/04* (2006.01)

(52) U.S. Cl.
CPC ............. *G06F 1/1656* (2013.01); *E05D 3/02* (2013.01); *E05D 5/04* (2013.01); *F16C 11/04* (2013.01); *G06F 1/1654* (2013.01); *G06F 1/1679* (2013.01); *G06F 1/1683* (2013.01); *H01Q 1/2266* (2013.01); *H05K 5/0017* (2013.01); *H05K 5/0204* (2013.01); *H05K 5/04* (2013.01); *H05K 5/061* (2013.01); *H05K 5/069* (2013.01); *E05Y 2900/606* (2013.01); *G06F 1/1616* (2013.01)

(58) Field of Classification Search
CPC .... G06F 1/1656; G06F 1/1654; G06F 1/1683; G06F 1/1679; G06F 1/1616; E05D 3/02; E05D 5/04; F16C 11/04; H05K 5/0017; H05K 5/04; H05K 5/0204; H05K 5/061; H05K 5/069; H01Q 1/2266; H01Q 21/08; E05Y 2900/606
See application file for complete search history.

(56) References Cited

U.S. PATENT DOCUMENTS 5,666,261 A * 9/1997 Aguilera ............... B32B 3/12
361/679.09
7,158,376 B2 * 1/2007 Richardson ........... G06F 1/1626
361/679.56
7,907,394 B2 * 3/2011 Richardson ........... G06F 1/1613
361/679.3

(Continued)

*Primary Examiner* — Abhishek M Rathod

(57) ABSTRACT

A display unit assembly of a laptop is provided and includes a metal base and a panel. The metal base has a first surface and a second surface corresponding in position to the first surface. The metal base includes a base body and a receiving recess disposed on the base body. The panel is disposed in the receiving recess and on the second surface. The panel includes a panel body and a signal transmission line connected to the panel body.

11 Claims, 11 Drawing Sheets

(56) References Cited

U.S. PATENT DOCUMENTS

| | | | |
|---|---|---|---|
| D649,149 S * | 11/2011 | Peng | D14/315 |
| 8,279,599 B2 * | 10/2012 | Hsiao | G06F 1/1616 |
| | | | 361/679.55 |
| 8,342,325 B2 * | 1/2013 | Rayner | A45C 11/00 |
| | | | 206/320 |
| 9,545,140 B1 * | 1/2017 | Johnson | A45C 11/00 |
| 9,614,569 B2 * | 4/2017 | Alsberg | A45C 11/00 |
| 10,372,167 B1 * | 8/2019 | Hsu | G06F 1/1635 |
| 10,499,517 B2 * | 12/2019 | Boron | G02F 1/133308 |
| 10,516,431 B2 * | 12/2019 | DiLella | H02J 7/0044 |
| 10,585,450 B1 * | 3/2020 | Giazzon | G06F 1/1616 |
| 10,684,649 B2 * | 6/2020 | Chen | G06F 1/181 |
| 2007/0285878 A1 * | 12/2007 | Konno | G06F 1/1616 |
| | | | 361/679.28 |
| 2010/0321870 A1 * | 12/2010 | Hirai | G06F 1/1656 |
| | | | 361/679.01 |
| 2011/0128683 A1 * | 6/2011 | Hirao | G06F 1/1616 |
| | | | 361/679.01 |
| 2011/0228458 A1 * | 9/2011 | Richardson | A45F 5/00 |
| | | | 361/679.01 |
| 2011/0310553 A1 * | 12/2011 | Hsiao | G06F 1/1616 |
| | | | 361/679.55 |
| 2012/0206895 A1 * | 8/2012 | Shirasaka | G06F 1/1656 |
| | | | 361/807 |
| 2014/0002969 A1 * | 1/2014 | Hwang | G02F 1/133615 |
| | | | 361/679.01 |
| 2016/0147108 A1 * | 5/2016 | Takemoto | G02F 1/133308 |
| | | | 362/633 |
| 2017/0235342 A1 * | 8/2017 | Brown | G01R 33/4806 |
| | | | 361/679.3 |
| 2017/0370136 A1 * | 12/2017 | Huang | E05D 5/02 |

* cited by examiner

DISPLAY UNIT ASSEMBLY OF LAPTOP

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present disclosure relates to a display unit assembly and, more particularly, to a display unit assembly of a laptop.

Description of the Prior Art

A conventional display unit assembly of a laptop usually comprises element A, element B and a panel. The panel is fixed to element B and protected by element A and element B. The conventional display unit assembly passes a drop test of 3 or 4 m but not a stricter drop test of 6 m. In view of this, the conventional display unit assembly still has room for improvement in structural strength.

Therefore, it is imperative to augment the structural strength of a display unit assembly of a laptop by improving its structural design.

SUMMARY OF THE INVENTION

It is an objective of the present disclosure to provide a display unit assembly of a laptop.

In order to achieve the above and other objectives, the present disclosure provides a display unit assembly of a laptop, comprising a metal base and a panel. The metal base has a first surface and a second surface corresponding in position to the first surface. The metal base comprises a base body and a receiving recess disposed on the base body. The panel is disposed in the receiving recess. The panel is disposed on the second surface. The panel comprises a panel body and a signal transmission line connected to the panel body.

One of the advantages of the present disclosure is as follows: a display unit assembly of a laptop, as provided by the present disclosure, comprises a panel disposed in the receiving recess to augment the overall structural strength of the display unit assembly.

The technical features of the present disclosure are illustrated by specific embodiments, depicted with drawings, and described below. However, the drawings serve exemplary and illustrative purposes rather than limit the present disclosure

DETAILED DESCRIPTION OF THE EMBODIMENTS

A display unit assembly of a laptop is provided according to the present disclosure and hereunder illustrated by specific embodiments. Persons skilled in the art can gain insight into its advantages and effects accordingly. The present disclosure can be implemented or applied in accordance with any other variant embodiments. Various modifications and changes may be made to the details described in the specification from different perspectives and for different applications without departing from the spirit of the present disclosure. The accompanying drawings are deemed illustrative and thus are not drawn to scale. The embodiments presented below are illustrative of the technical features of the present disclosure rather than restrictive of the claims of the present disclosure. Although ordinal numbers, such as "first," "second," and "third," are used herein to specify components, the ordinal numbers are intended to distinguish the components from each other rather than limit them. The conjunction "or" used before the last in a list of possibilities must be interpreted, as appropriate, to mean an "exclusive or" or an "inclusive or".

[Embodiment]

Figure 1:
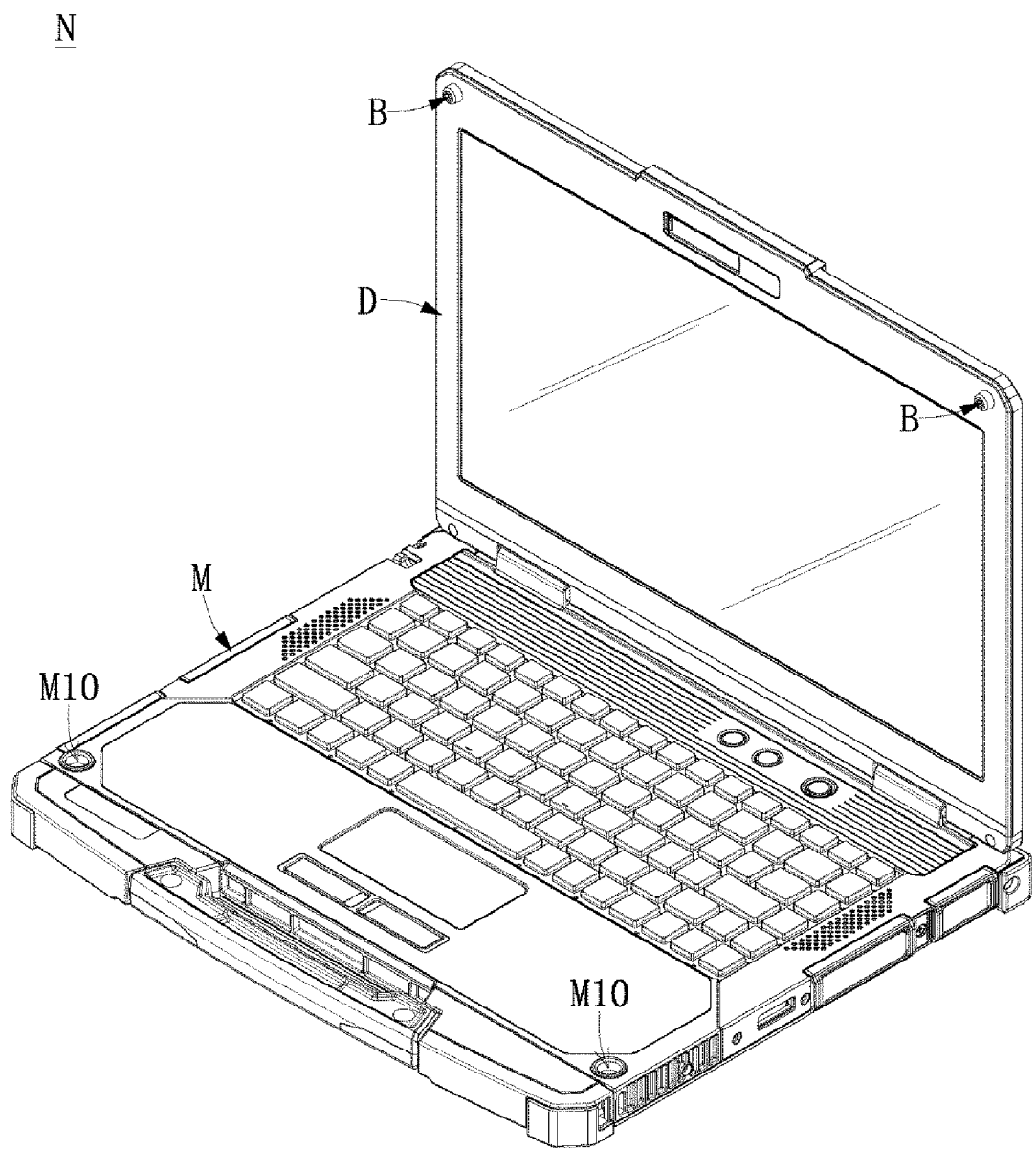
FIG. 1 is a perspective view of a laptop according to an embodiment of the present disclosure.
Figure 2:
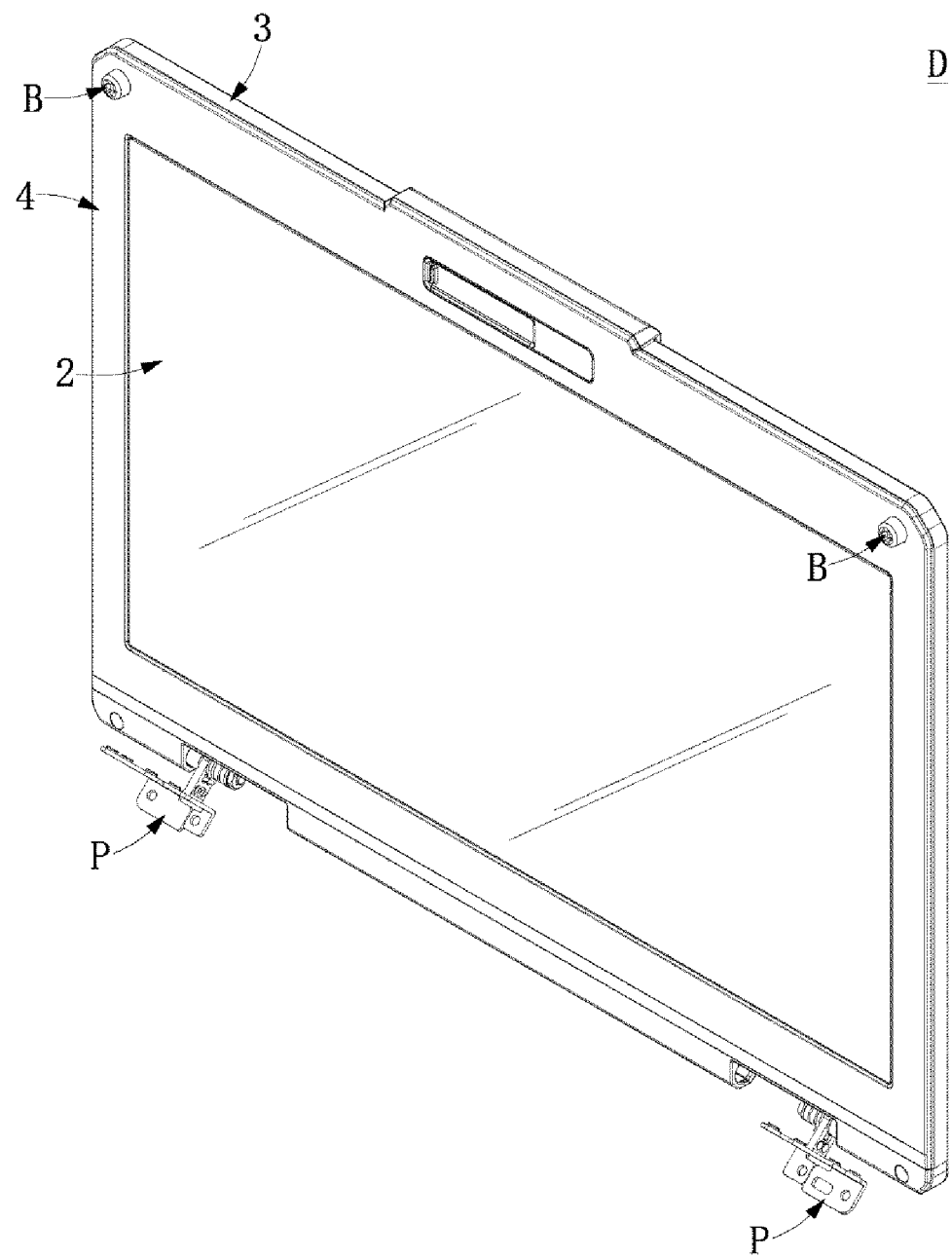
FIG. 2 is an assembled perspective view of a display unit assembly of the laptop according to an embodiment of the present disclosure.
Figure 3:
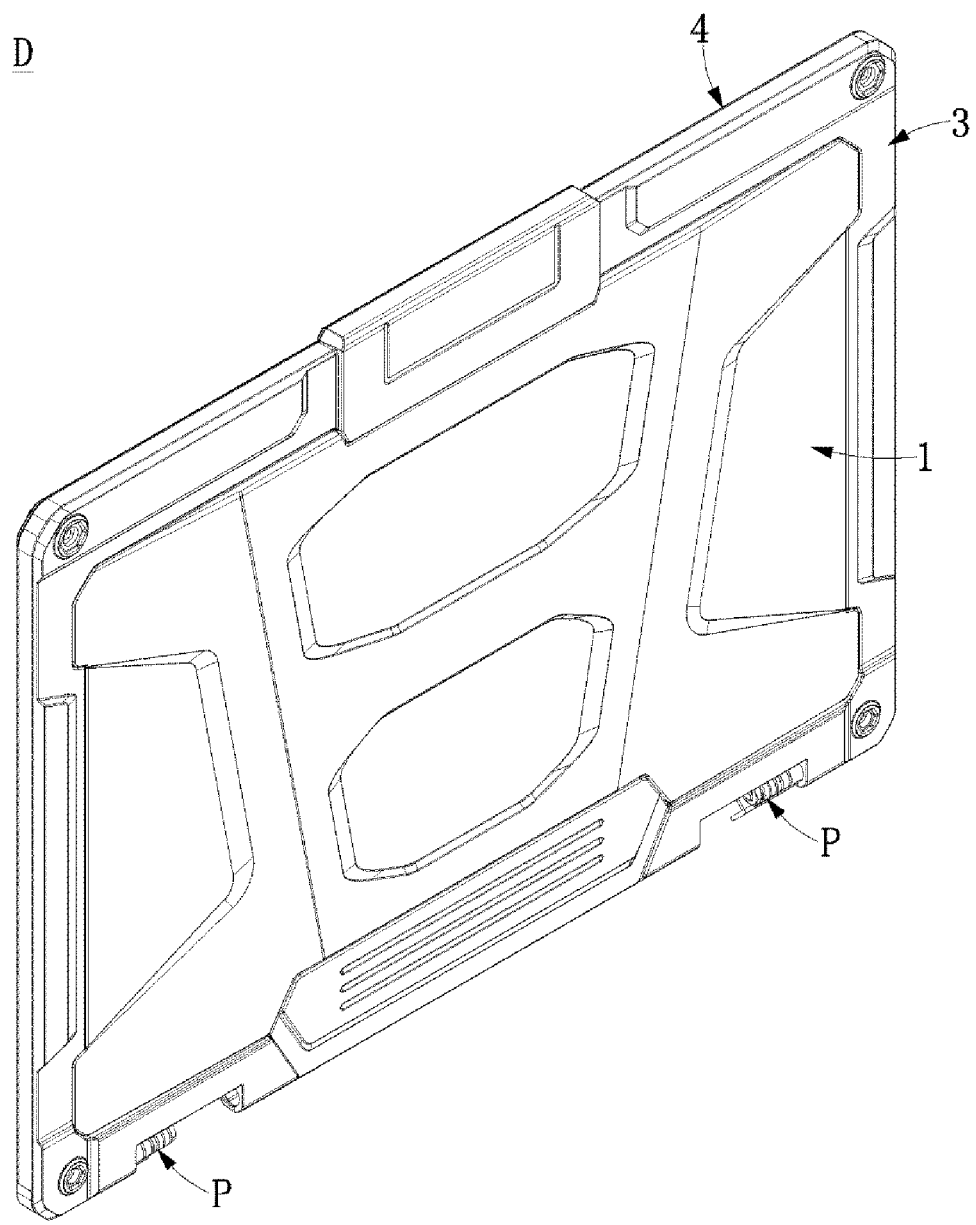
FIG. 3 is another assembled perspective view of the display unit assembly of the laptop according to an embodiment of the present disclosure.
Figure 4:
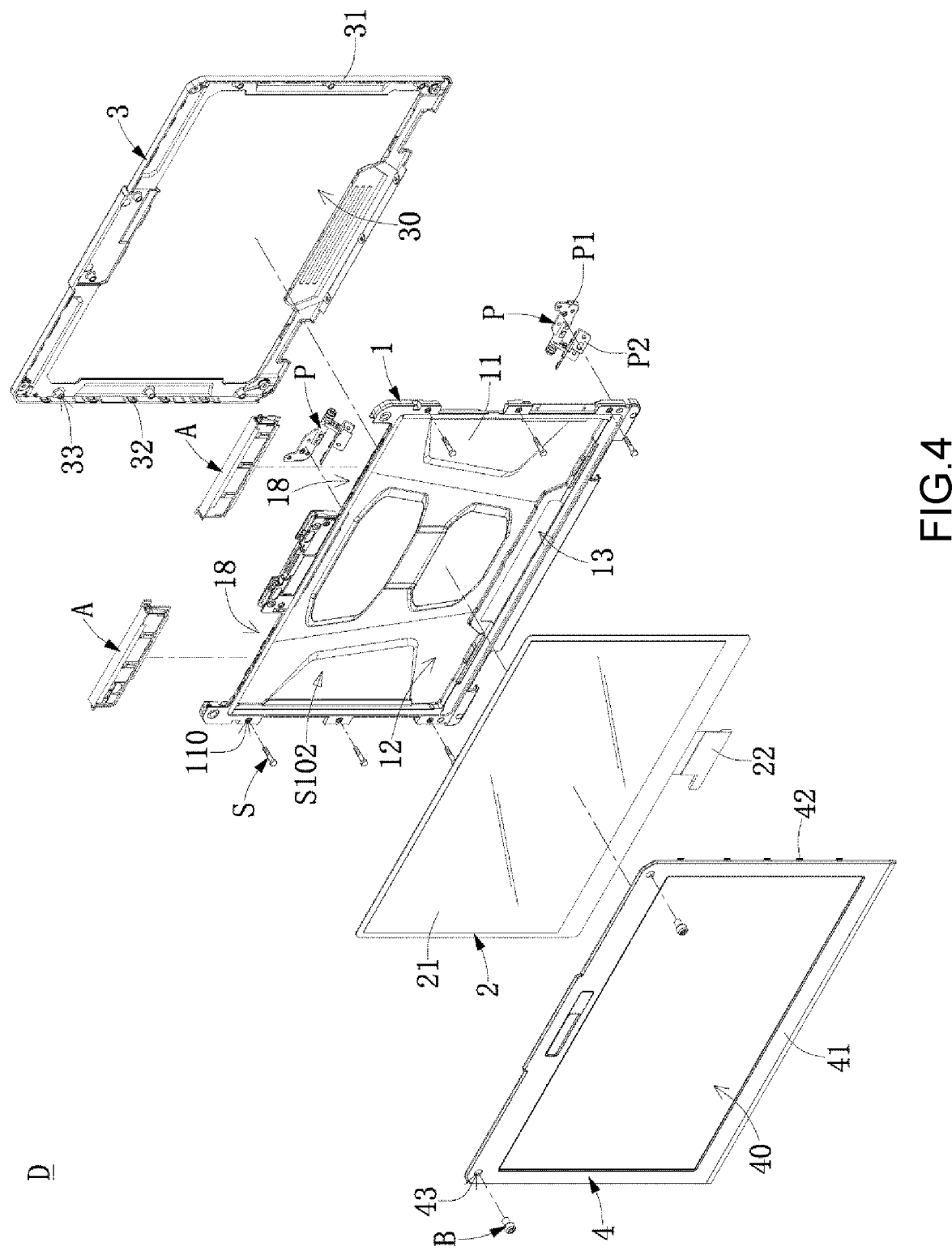
FIG. 4 is an exploded view of the display unit assembly of the laptop according to an embodiment of the present disclosure.
Figure 5:
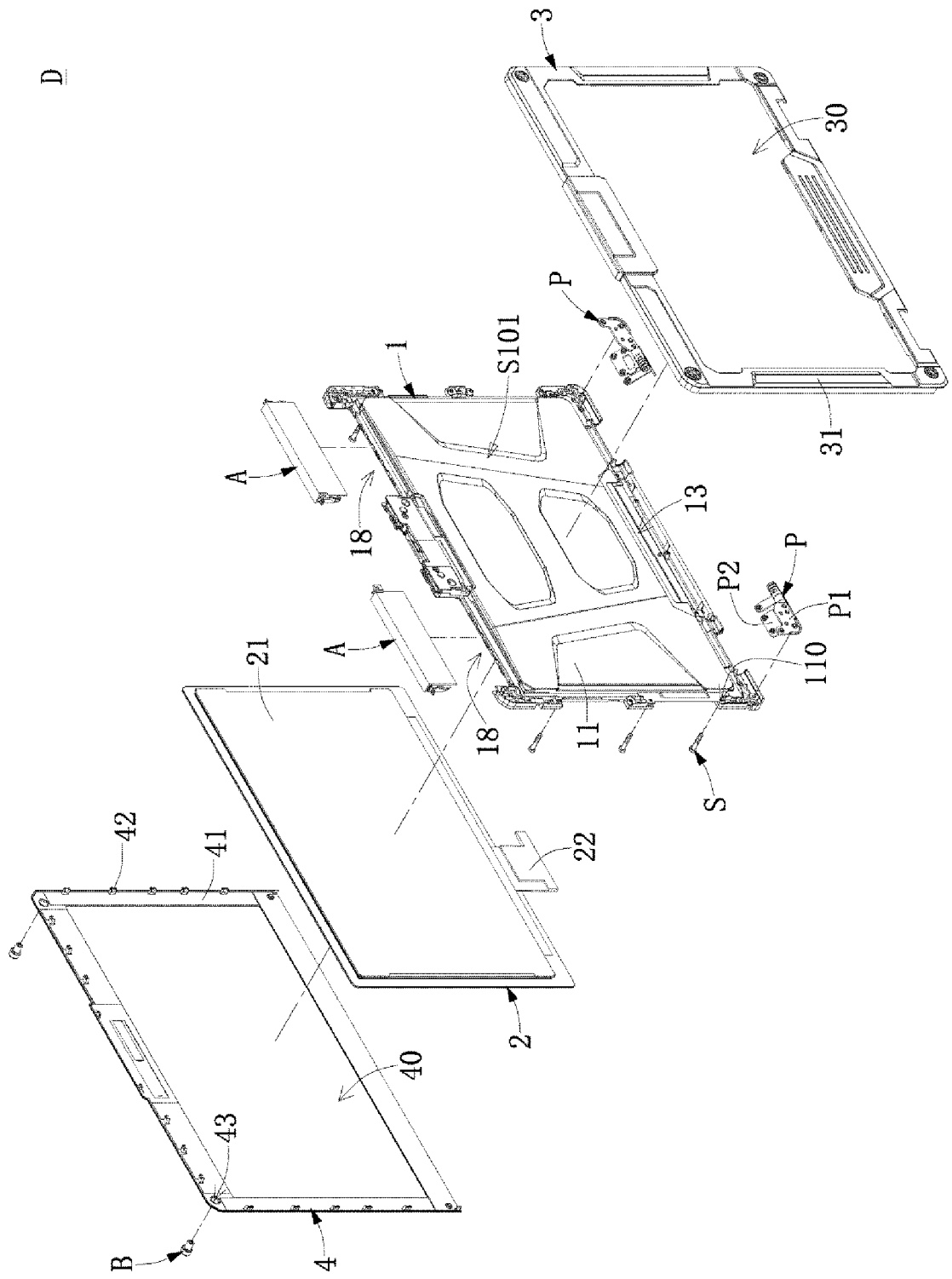
FIG. 5 is another exploded view of the display unit assembly of the laptop according to an embodiment of the present disclosure.

Refer to FIG. 1 through FIG. 5. FIG. 1 is a perspective view of a laptop according to an embodiment of the present disclosure. FIG. 2 and FIG. 3 are assembled perspective views of a display unit assembly of the laptop according to an embodiment of the present disclosure. FIG. 4 and FIG. 5 are exploded views of the display unit assembly of the laptop according to an embodiment of the present disclosure. The present disclosure provides a display unit assembly D of a laptop N. The display unit assembly D provided by the present disclosure is mainly applicable to a laptop. The laptop N comprises a host component M and a display unit assembly D. The display unit assembly D is disposed on the host component M. The display unit assembly D is capable of rotating pivotally relative to the host component M. The host component M comprises element C and element D of a laptop. FIG. 1 is a schematic view of the laptop N in its entirety, so as to depict the structure of the display unit assembly D clearly.

The display unit assembly D comprises a metal base 1 and a panel 2. The panel 2 is disposed on the metal base 1. For instance, the metal base 1 is made of an aluminum-magnesium alloy to support the panel 2 and protect the panel 2, but the present disclosure is not limited thereto. The metal base 1 has a first surface S101 and a second surface S102 corresponding in position to the first surface S101. The metal base 1 comprises a base body 11 and a receiving recess 12 disposed on the base body 11. The panel 2 is disposed in the receiving recess 12. The panel 2 comprises a panel body 21 and a signal transmission line 22 connected to the panel body 21. For instance, the panel body 21 is disposed in the receiving recess 12 of the metal base 1 and rests on the second surface S102. The panel body 21 is fixed to the second surface S102 of the metal base 1 by an adhesive (not shown). The metal base 1 further comprises an opening 13 that penetrates the base body 11. The signal transmission line 22 passes through the opening 13. Therefore, the signal transmission line 22 is electrically connected to the host component M by passing through the opening 13.

The display unit assembly D of the laptop N further comprises a pivotal unit P. The pivotal unit P is disposed on the metal base 1. The pivotal unit P comprises a first pivotal plate P1 disposed on the metal base 1 and a second pivotal plate P2 corresponding in position to the first pivotal plate P1 and capable of rotating pivotally relative to the first pivotal plate P1. The second pivotal plate P2 is disposed on the host component M, such that the display unit assembly D is capable of rotating pivotally relative to the host component M.

The laptop N further comprises at least one antenna module A. The antenna module A is disposed on the metal base 1. For instance, the metal base 1 comprises at least one receiving slot 18 corresponding in position to the antenna module A. The antenna module A is disposed in the receiving slot 18.

Referring to FIG. 1 through FIG. 5, preferably, the display unit assembly D of the laptop N further comprises a first decorative board 3. The first decorative board 3 is disposed on the first surface S101 of the metal base 1. The first decorative board 3 has a first opening 30 for exposing the first surface S101 of the metal base 1. When the first decorative board 3 is mounted on the metal base 1, the first surface S101 of the metal base 1 is exposed from the first decorative board 3. For instance, the first decorative board 3 and the metal base 1 are made of different materials. In a variant embodiment, the first decorative board 3 is made of plastic, but the present disclosure is not limited thereto.

The first decorative board 3 comprises a first frame body 31. The first opening 30 is surrounded by the first frame body 31. The first frame body 31 hides the periphery of the metal base 1 and the opening 13. Therefore, the vertical projection of the opening 13 of the metal base 1 on the first decorative board 3 overlaps the first frame body 31 of the first decorative board 3, such that the first decorative board 3 hides the opening 13 of the metal base 1.

Referring to FIG. 1 through FIG. 5, the display unit assembly D of the laptop N further comprises a second decorative board 4. The second decorative board 4 is disposed on the second surface S102 of the metal base 1. The second decorative board 4 has a second opening 40 for exposing the panel body 21 disposed on the second surface S102 of the metal base 1. Therefore, when the second decorative board 4 is mounted on the metal base 1, the panel body 21 is exposed from the second decorative board 4. For instance, the second decorative board 4 and the metal base 1 are made of different materials. In a variant embodiment, the second decorative board 4 is made of plastic, but the present disclosure is not limited thereto. The second decorative board 4 comprises a second frame body 41 which surrounds the second opening 40. The second frame body 41 hides the periphery of the metal base 1.

Figure 6:
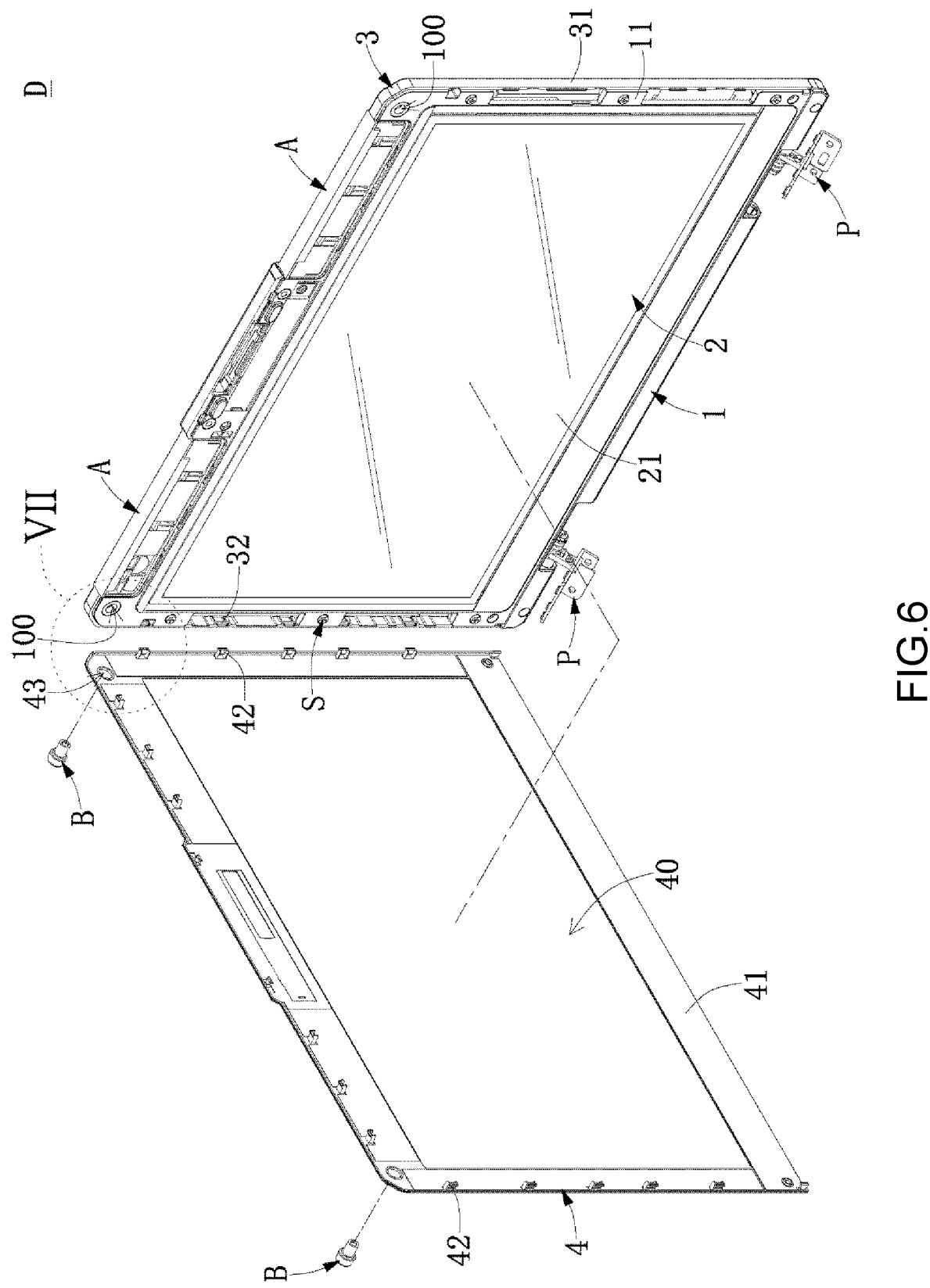
FIG. 6 is yet another exploded view of the display unit assembly of the laptop according to an embodiment of the present disclosure.
Figure 7:
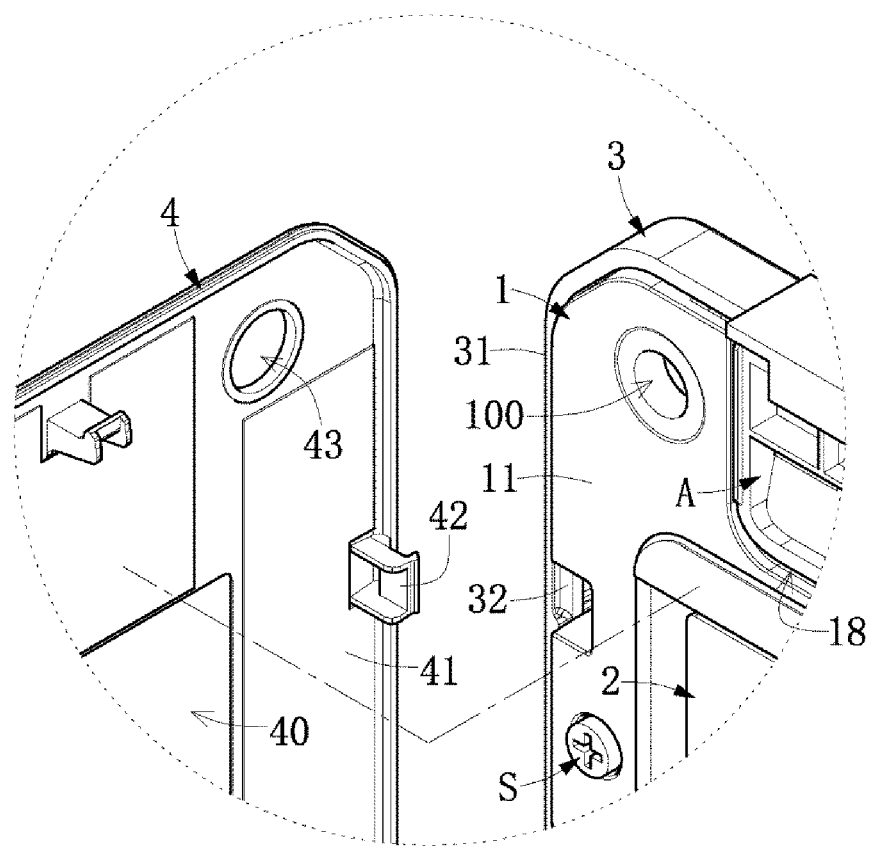
FIG. 7 is an enlarged view of part VII of FIG. 6.

Refer to FIG. 1 through FIG. 5, FIG. 6 and FIG. 7. FIG. 6 is yet another exploded view of the display unit assembly of the laptop according to an embodiment of the present disclosure. FIG. 7 is an enlarged view of part VII of FIG. 6. For instance, the display unit assembly D is assembled by placing the antenna module A in the receiving slot 18 of the metal base 1, placing the panel 2 in the receiving recess 12 of the metal base 1, and placing the first decorative board 3 on the metal base 1, such that the first decorative board 3 is disposed on the metal base 1. For instance, the display unit assembly D further comprises a plurality of fastening elements S, whereas a plurality of fastening holes 110 are disposed on the base body 11 of the metal base 1. The first decorative board 3 further comprises a plurality of fastening apertures 33. The plurality of fastening apertures 33 of the first decorative board 3 correspond in position to the plurality of fastening holes 110 of the base body 11, respectively. The first decorative board 3 is disposed on the metal base 1 by the plurality of fastening elements S. However, the present disclosure is not limited to fixing the first decorative board 3 to the metal base 1.

The first decorative board 3 comprises at least one first engaging portion 32 disposed on the first frame body 31. The second decorative board 4 comprises a second engaging portion 42 disposed on the second frame body 41 and corresponding in position to the first engaging portion 32. The second decorative board 4 is fixed to the first engaging portion 32 of the first decorative board 3 by the second engaging portion 42. Therefore, the second engaging portion 42 of the second decorative board 4 is engaged with the first engaging portion 32 of the first decorative board 3; thus, the second decorative board 4 is fixed to the first decorative board 3 and the metal base 1. For instance, in an embodiment illustrated by the diagrams, the second engaging portion 42 is a hook, and the first engaging portion 32 is an engaging slot. The second engaging portion 42 and the first engaging portion 32 are engaged with each other. However, the present disclosure is not limited to the first engaging portion 32 and second engaging portion 42.

Figure 8:
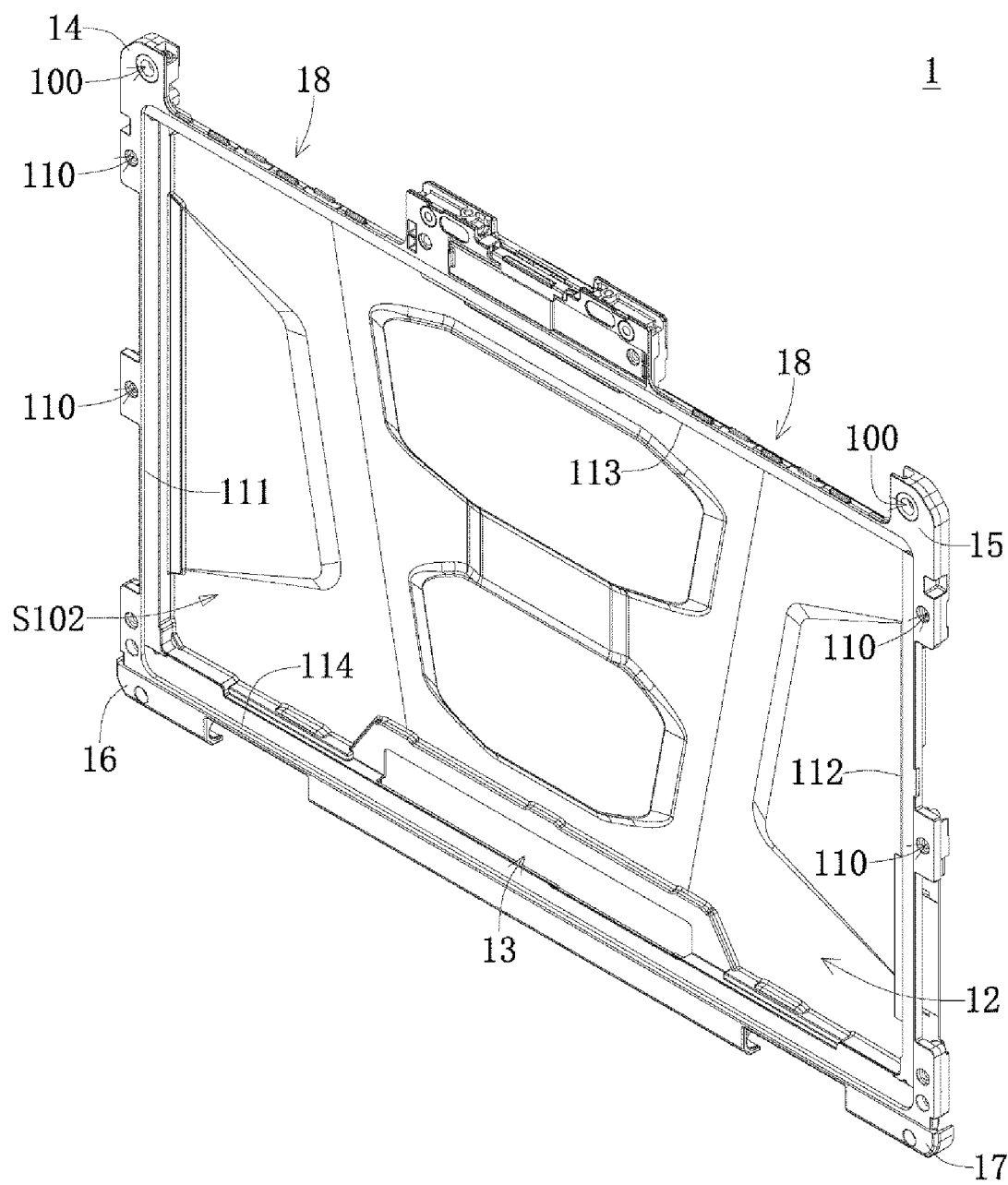
FIG. 8 is a perspective view of a metal base of the display unit assembly of the laptop according to an embodiment of the present disclosure.
Figure 9:
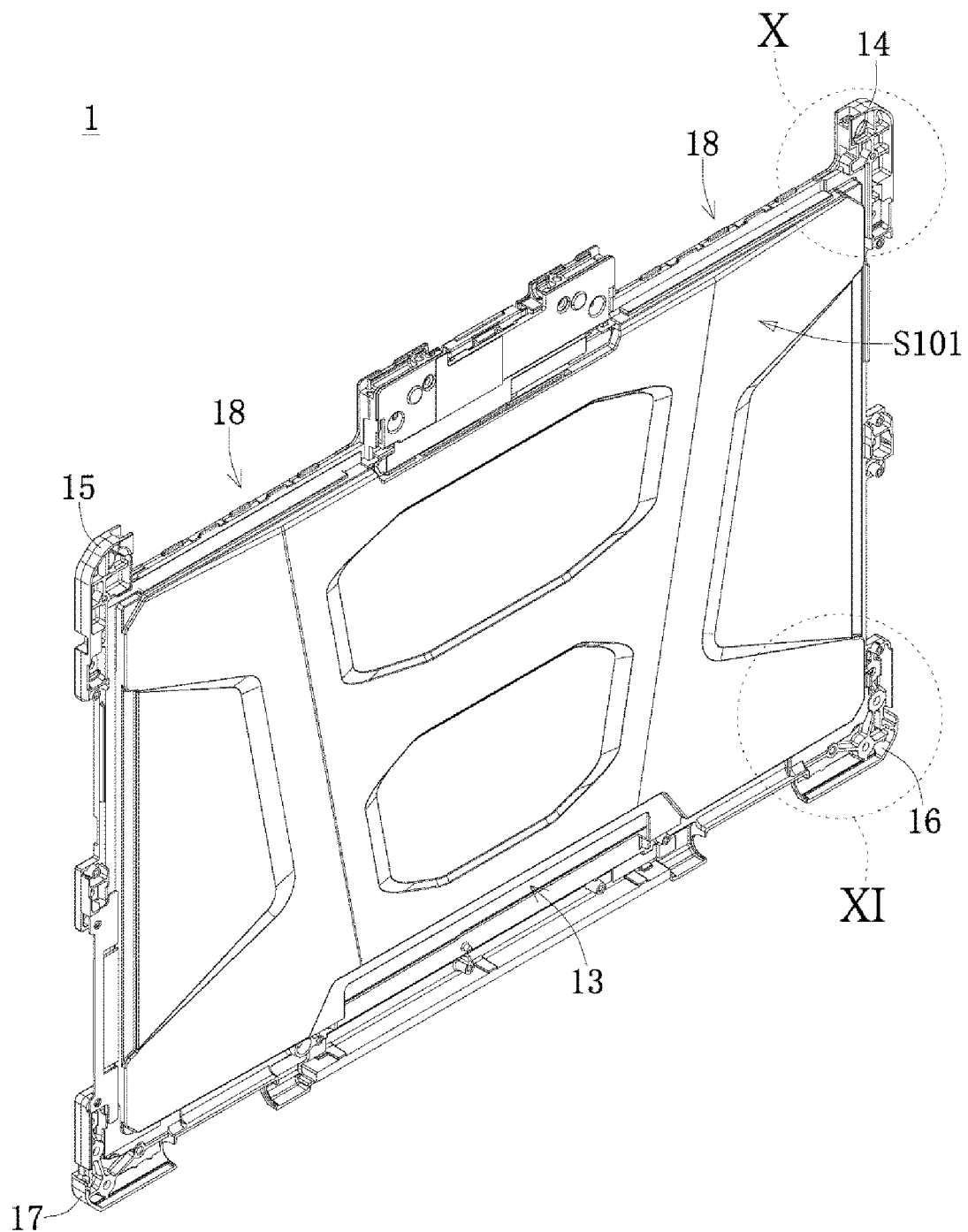
FIG. 9 is another perspective view of the metal base of the display unit assembly of the laptop according to an embodiment of the present disclosure.
Figure 10:
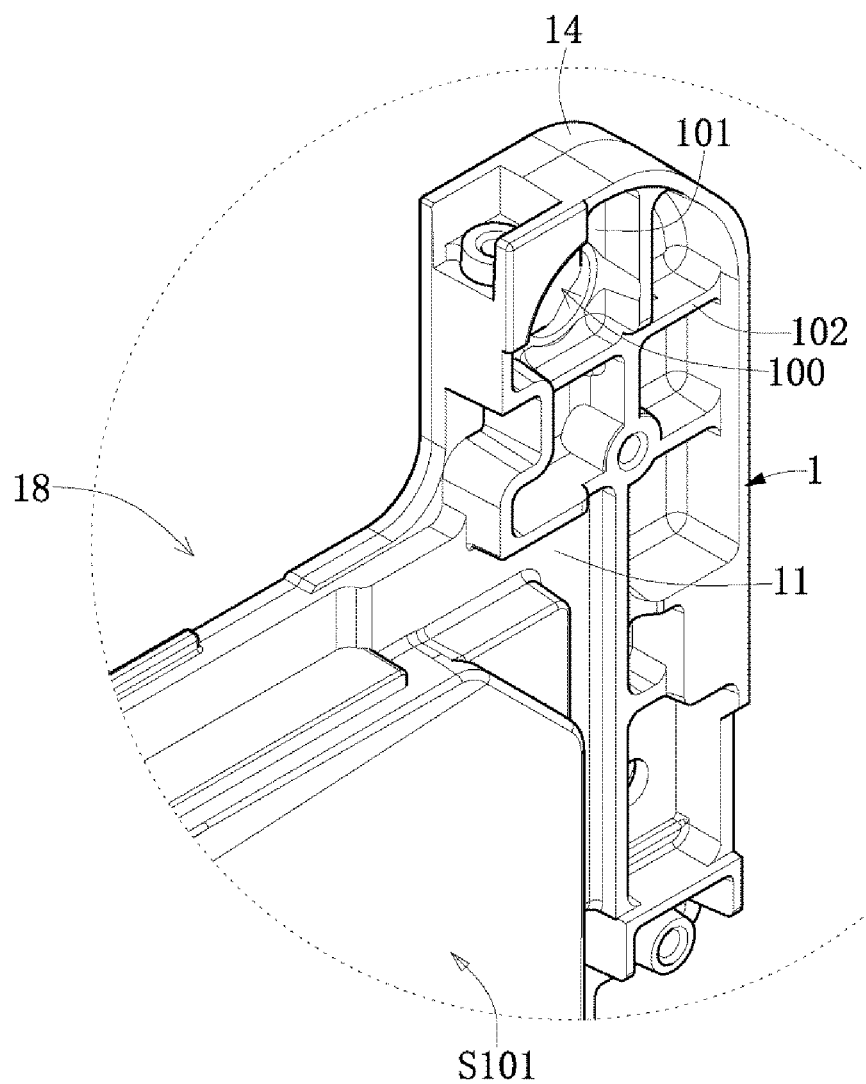
FIG. 10 is an enlarged view of part X of FIG. 9.
Figure 11:
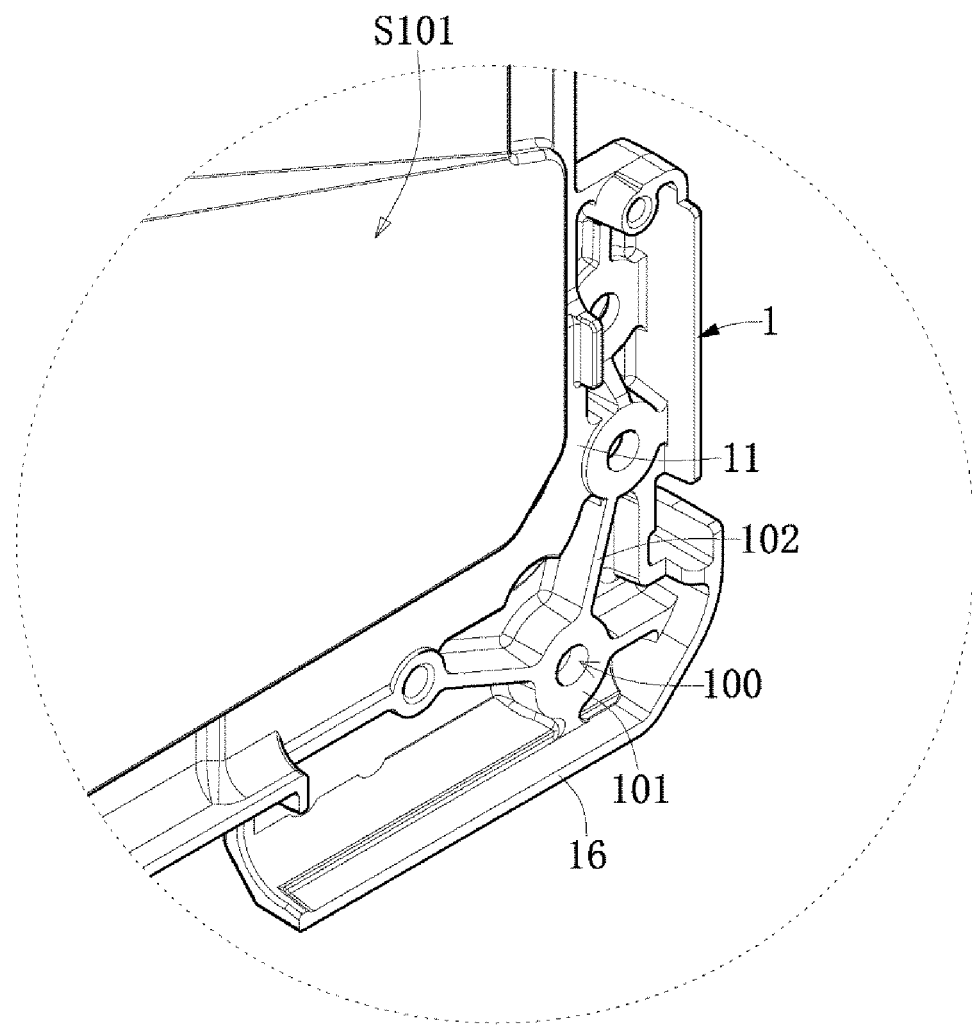
FIG. 11 is an enlarged view of part XI of FIG. 9.

Refer to FIG. 8 through FIG. 11. FIG. 8 and FIG. 9 are perspective views of a metal base of the display unit assembly of the laptop according to an embodiment of the present disclosure. FIG. 10 is an enlarged view of part X of FIG. 9. FIG. 11 is an enlarged view of part XI of FIG. 9. The base body 11 has a first edge 111, a second edge 112 corresponding in position to the first edge 111, a third edge 113, and a fourth edge 114 corresponding in position to the third edge 113. The metal base 1 further comprises a first extension angle 14 connected to a corner of the base body 11 and a second extension angle 15 connected to another corner of the base body 11. The first extension angle 14 is disposed at a corner between the first edge 111 and third edge 113. The second extension angle 15 is disposed at another corner between the second edge 112 and third edge 113. The receiving slot 18 for receiving the antenna module A is disposed between the first extension angle 14 and second extension angle 15. Preferably, the metal base 1 further comprises a third extension angle 16 connected to yet another corner of the base body 11 and a fourth extension angle 17 connected to still yet another corner of the base body 11. The third extension angle 16 is disposed at yet another corner between the first edge 111 and third edge 113. The fourth extension angle 17 is disposed at still yet another corner between the second edge 112 and fourth edge 114. The first extension angle 14, second extension angle 15, third extension angle 16 and fourth extension angle 17 are disposed at four corners of the receiving recess 12, respectively. Therefore, when the laptop N falls, the first extension angle 14, second extension angle 15, third extension angle 16 and/or fourth extension angle 17 can protect the panel 2 against an impact which might otherwise damage the panel 2. Preferably, the base body 11, first extension angle 14, second extension angle 15, third extension angle 16 and fourth extension angle 17 are integrally formed, so as to form the metal base 1.

Referring to FIG. 10 and FIG. 11, the structures of the first extension angle 14, second extension angle 15, third extension angle 16 and fourth extension angle 17 are described in detail below. The first extension angle 14 and second extension angle 15 are similar. The third extension angle 16 and fourth extension angle 17 are similar. The description below is exemplified by the first extension angle 14 and third extension angle 16. For the sake of brevity, the second extension angle 15 and fourth extension angle 17 are not further described below.

As shown in FIG. 10, the first extension angle 14 and second extension angle 15 each comprise a positioning portion 101 with a positioning hole 100 and a rib 102 connected between the positioning portion 101 and the base body 11. Therefore, the ribs 102 of the first extension angle 14 and second extension angle 15 augment the structural strength of the metal base 1. Referring to FIG. 1, FIG. 4 and FIG. 5, the display unit assembly D further comprises a plurality of positioning posts B, whereas the second decorative board 4 comprises a plurality of positioning apertures 43. The positioning holes 100 of the first extension angle 14 and second extension angle 15 correspond in position to the positioning apertures 43 of the second decorative board 4. The plurality of positioning posts B are disposed in the positioning holes 100 of the first extension angle 14 and second extension angle 15 and the positioning apertures 43 of the second decorative board 4, respectively. The host component M of the laptop N further comprises a limiting hole M10 corresponding in position to the positioning posts B. Therefore, when the display unit assembly D rotates pivotally relative to the host component M to enter a shut state, the positioning posts B are inserted into the limiting hole M10. As a result, when the display unit assembly D is hit, the position of the display unit assembly D relative to the host component M remains unchanged, thereby protecting the pivotal unit P against damage. The positioning holes 100 of the first extension angle 14 and second extension angle 15 of the metal base 1 may also serve the same function as the fastening holes 110 of the metal base 1. Therefore, in a variant embodiment, the fastening elements S are fastened to the positioning holes 100 of the metal base 1 and the fastening apertures 33 of the first decorative board 3.

As shown in FIG. 11, the third extension angle 16 and fourth extension angle 17 each comprise a positioning portion 101 with a positioning hole 100 and a rib 102 connected between the positioning portion 101 and the base body 11. Therefore, the ribs 102 of the third extension angle 16 and fourth extension angle 17 augment the structural strength of the metal base 1. The positioning holes 100 of the third extension angle 16 and fourth extension angle 17 of the metal base 1 may also serve the same function as the fastening holes 110 of the metal base 1, thereby fixing the pivotal unit P to the positioning holes 100 of the third extension angle 16 and fourth extension angle 17 with fastening elements (not shown).

[Beneficial Effects of Embodiment]

One of the beneficial effects of the present disclosure is as follows: according to the present disclosure, the display unit assembly D of the laptop N advantageously comprises the panel 2 disposed in the receiving recess 12 to augment the overall structural strength of the display unit assembly D of the laptop N.

According to the present disclosure, the display unit assembly D of the laptop N advantageously comprises the first decorative board 3 disposed on the first surface S101 of the metal base 1 and having a first opening 30 for exposing the first surface S101 of the metal base 1, such that the first surface S101 of the metal base 1 functions as the outer surface of the display unit assembly D, so as to augment the overall structural strength of the display unit assembly D and reduce the total weight of the display unit assembly D despite limited space.

The present disclosure is disclosed above by preferred embodiments. However, the preferred embodiments are not restrictive of the claims of the present disclosure. Hence, all equivalent technical changes made to the aforesaid embodiments and based on the contents of the specification and drawings of the present disclosure shall fall within the scope of the claims of the present disclosure.

What is claimed is:

1. A display unit assembly of a laptop, comprising:
   a metal base having a first surface and a second surface corresponding in position to the first surface, the metal base comprising a base body and a receiving recess disposed on the base body; and
   a panel disposed in the receiving recess and on the second surface, wherein the panel comprises a panel body and a signal transmission line connected to the panel body;
   a first decorative board having a first opening, a first frame body, and a first engaging portion, the first decorative board being disposed on the first surface of the metal base, the first opening being adapted to expose the first surface of the metal base, and the first engaging portion being disposed on the first frame body.

2. The display unit assembly of a laptop according to claim 1, wherein the metal base further comprises an opening penetrating the base body, and the signal transmission line passes through the opening.

3. The display unit assembly of a laptop according to claim 1, further comprising a pivotal unit disposed on the metal base, the pivotal unit comprising a first pivotal plate disposed on the metal base and a second pivotal plate corresponding in position to the first pivotal plate and capable of rotating pivotally relative to the first pivotal plate.

4. The display unit assembly of a laptop according to claim 1, further comprising a plurality of fastening elements whereby the first decorative board is disposed on the metal base.

5. The display unit assembly of a laptop according to claim 1, further comprising a second decorative board disposed on the second surface of the metal base and having a second opening for exposing the panel body disposed on the first surface of the metal base, wherein the second decorative board comprises a second frame body and a second engaging portion disposed on the second frame body and corresponding in position to the first engaging portion, wherein the second decorative board is fixed to the first engaging portion of the first decorative board by the second engaging portion.

6. The display unit assembly of a laptop according to claim 1, wherein the metal base further comprises a first extension angle connected to a corner of the base body and a second extension angle connected to another corner of the base body.

7. The display unit assembly of a laptop according to claim 6, wherein the base body has a first edge, a second edge corresponding in position to the first edge, a third edge, and a fourth edge corresponding in position to the third edge, with the first extension angle disposed at a said corner between the first edge and the third edge, and the second extension angle disposed at another said corner between the second edge and the third edge.

8. The display unit assembly of a laptop according to claim 7, wherein the metal base further comprises a third extension angle connected to yet another corner of the base body and a fourth extension angle connected to still yet another corner of the base body.

9. The display unit assembly of a laptop according to claim 8, wherein the third extension angle is disposed at yet another said corner between the first edge and the third edge, and the fourth extension angle is disposed at still yet another said corner between the second edge and the fourth edge.

10. The display unit assembly of a laptop according to claim 7, wherein the first extension angle and the second extension angle each comprise a positioning portion with a positioning hole and a rib connected between the positioning portion and the base body.

11. The display unit assembly of a laptop according to claim 10, further comprising a plurality of positioning posts disposed in the positioning holes of the first extension angle and the second extension angle, respectively.

* * * * *